United States Patent
Kondo (10) Patent No.: US 11,271,416 B2
(45) Date of Patent: Mar. 8, 2022

(54) METHODS AND APPARATUS FOR A BATTERY

(71) Applicant: SEMICONDUCTOR COMPONENTS INDUSTRIES, LLC, Phoenix, AZ (US)

(72) Inventor: Hideo Kondo, Oizumi-machi (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 191 days.

(21) Appl. No.: 16/689,194

(22) Filed: Nov. 20, 2019

(65) Prior Publication Data
US 2021/0152003 A1    May 20, 2021

(51) Int. Cl.
*H02J 7/00* (2006.01)
*H01M 10/48* (2006.01)
*H01M 10/42* (2006.01)

(52) U.S. Cl.
CPC ......... *H02J 7/0063* (2013.01); *H01M 10/425* (2013.01); *H01M 10/48* (2013.01); *H01M 2010/4271* (2013.01); *H02J 2007/0067* (2013.01)

(58) Field of Classification Search
USPC .......................................................... 320/136
See application file for complete search history.

(56) References Cited

U.S. PATENT DOCUMENTS

| | | | |
|---|---|---|---|
| 2005/0046387 A1* | 3/2005 | Aker | H02J 7/0071 320/125 |
| 2009/0027007 A1 | 1/2009 | Iwane | |
| 2012/0274145 A1* | 11/2012 | Taddeo | H02J 1/12 307/82 |
| 2014/0006655 A1 | 1/2014 | Chan | |
| 2015/0280290 A1 | 10/2015 | Saha | |
| 2020/0099233 A1* | 3/2020 | Hollweg | H02J 7/0014 |

* cited by examiner

*Primary Examiner* — Bryce M Aisaka
(74) *Attorney, Agent, or Firm* — Dickinson Wright PLLC (57) ABSTRACT

Various embodiments of the present technology may provide methods and apparatus for a battery. The apparatus may compute an ideal energy capability of the battery and an actual energy capability of the battery. The apparatus may compare the energy capabilities and determine whether to supply current to a load according to a default duty cycle or an adjusted duty cycle. The apparatus may provide an adjusted duty cycle by increasing the pulse width of the duty cycle or increasing the total period of the duty cycle.

18 Claims, 9 Drawing Sheets

METHODS AND APPARATUS FOR A BATTERY

BACKGROUND OF THE TECHNOLOGY

Many electronic devices powered by a battery must determine whether the battery has sufficient power capability to perform a pre-defined function or task. As such, a battery management system provides an indicator, referred to as the state of function (SOF), to represent the battery's ability to meet the load demands for a particular function. In many battery management systems, the state of function is represented by a digital signal, where a "0" means that the battery cannot deliver the required power to perform the pre-defined task and a "1" means that the battery can deliver the required power to perform the pre-defined task. Conventional battery management systems, however, are binary and the system will perform the pre-defined task only if the battery management system determines that the battery has sufficient power to do so.

In many battery-powered electronic devices, the pre-defined functions and tasks may be initiated by a user of the device, for example by pressing a button on the electronic device. The user expects the device to perform the function/task when the user pushes the button. In convention battery management systems, however, if the user initiates a function/task and the battery management system determines that the battery doesn't have sufficient power to perform the function/task, the electronic device will not perform the requested function/task. Therefore, it may be desired to predict the maximum energy capability of the battery and dynamically adjust the energy provided to the load to ensure that the function/task initiated by the user is performed at the time desired by the user.

SUMMARY OF THE INVENTION

Various embodiments of the present technology may provide methods and apparatus for a battery. The apparatus may compute an ideal energy capability of the battery and an actual energy capability of the battery. The apparatus may compare the energy capabilities and determine whether to supply current to a load according to a default duty cycle or an adjusted duty cycle based on the comparison. The apparatus may provide an adjusted duty cycle by increasing the pulse width of the duty cycle or increasing the total period of the duty cycle.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, switches, semiconductor devices, such as transistors and capacitors, and the like, which may carry out a variety of functions. In addition, the present technology may be integrated in any number of electronic systems, such as automotive, aviation, "smart devices," portables, e-cigarettes, aroma therapy puff systems, vaping devices, and consumer electronics, and the systems described are merely exemplary applications for the technology.

Figure 1:
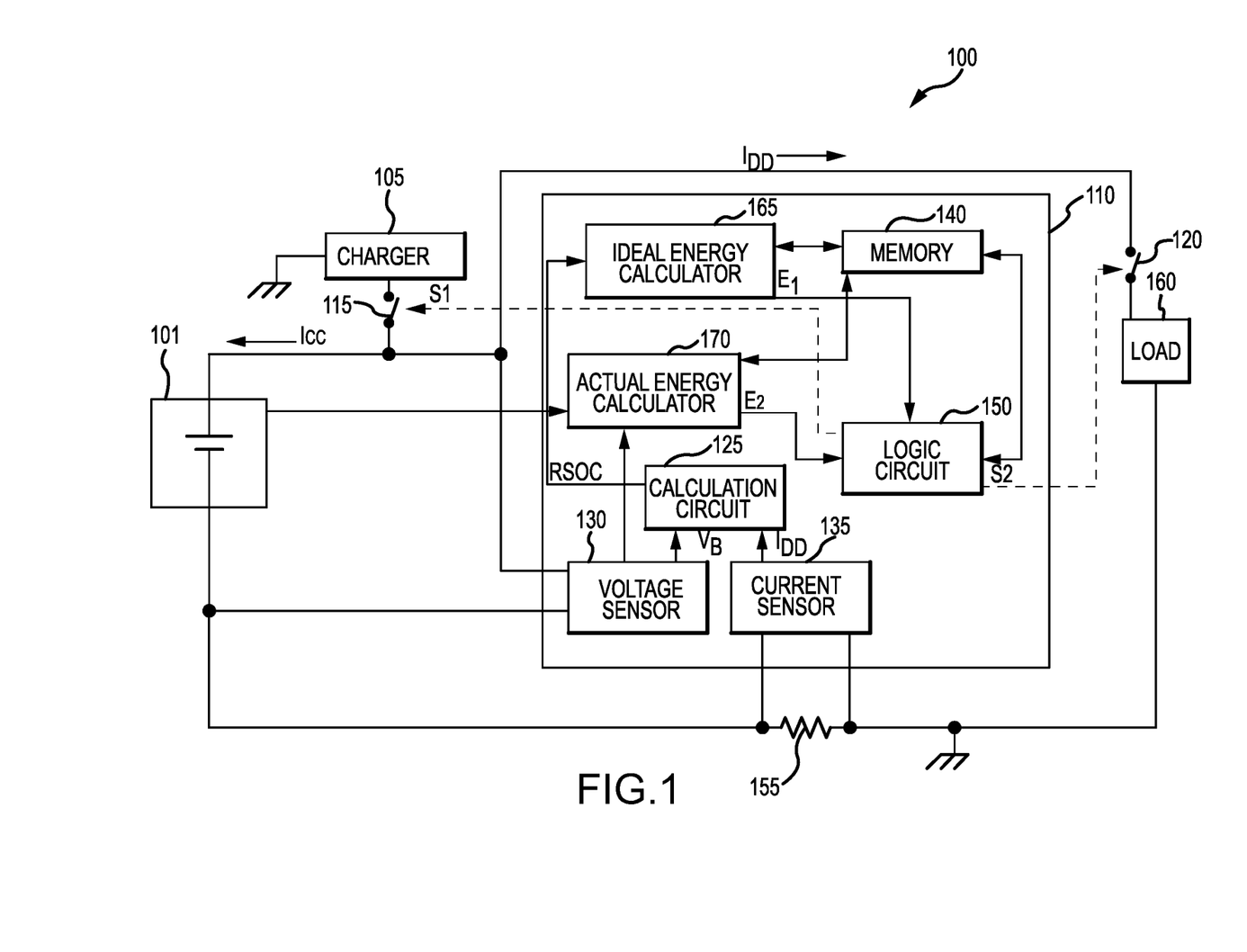
FIG. 1 is a block diagram of a battery system in accordance with an exemplary embodiment of the present technology.

Methods and apparatus for a battery according to various aspects of the present technology may operate in conjunction with any suitable electronic system and/or device, such as "smart devices," wearables, battery-powered consumer electronics, portable devices, battery-powered vehicles, and the like. Referring to FIG. 1, an exemplary system 100 may be integrated in an electronic device (not shown), such as a vaping device or an electric vehicle, powered by a rechargeable battery 101, such as a lithium ion battery. For example, in various embodiments, the battery 101 may operate in conjunction with a charger 105 and a fuel gauge circuit 110 to provide power to a load 160, such as a heating coil in the vaping device or a motor in the electric vehicle.

According to various embodiments, the system 100 may further comprise a host control system (not shown) that is in communication with the fuel gauge circuit 110 and may act as an interface between user controls/buttons and the fuel gauge circuit 110. For example, a user of the electronic device may press a button that initiates a particular function/task. The host control system may detect that the button was pressed and send a start signal (or other initializing signal) to the fuel gauge circuit 110, wherein the start signal may activate a number of computations and functions performed by the fuel gauge circuit 110.

According to an exemplary embodiment, the system 100 may comprise a first switch 115 to selectively connect the charger 105 to the battery 101, and a second switch 120 to selectively connect the battery 101 to the load 160. According to an exemplary embodiment, the fuel gauge circuit 110 may operate the first switch 115 according to a first signal S1 and operate the second switch 120 according to a second signal S2 that is pulse-width modulated. The first switch 115, in conjunction with the first signal S1, may control current flow from the charger 105 to the battery 101 (also referred to as a charge current $I_{CC}$). The second switch 120, in conjunction with the pulse-width modulated second signal S2, may control current flow from the battery 101 to the load 160.

The fuel gauge circuit 110 may be configured to manage various battery operations and monitor various battery conditions. For example, the fuel gauge circuit 110 may be configured to measure a voltage $V_B$ of the battery 101, measure a current $I_{DD}$ from the battery 101 to the load 160 (referred to as a load current $I_{DD}$), compute a remaining capacity (also expressed as a percentage and referred to as the relative state of charge RSOC) of the battery 101, compute a state of health (SOH) of the battery 101, estimate a lifespan of the battery 101, determine an energy capability of the battery, and the like.

In addition, the fuel gauge circuit 110 may be configured to store various battery data. For example, the fuel gauge circuit 110 may store predetermined battery characteristics, such as open circuit voltage values of the battery 101 as a function of the capacity (i.e., RSOC) of the battery 101. The fuel gauge circuit 110 may also store predetermined values, such as a predetermined threshold voltage value $V_{TH}$, a pre-defined duty cycle with a default pulse width $T_{W\_DEF}$ and a default total period $T_{P\_DEF}$, and a pre-defined load current $I_{DD\_1}$.

In an exemplary embodiment, the fuel gauge circuit 110 may comprise a voltage sensor 130 to measure the voltage $V_B$ of the battery 101. The voltage sensor 130 may be connected to the battery 101 and may comprise any circuit and/or device suitable for measuring a voltage potential.

In an exemplary embodiment, the fuel gauge circuit 110 may further comprise a current sensor 135 to measure the load current $I_{DD}$ to/from the battery 101 and the load 160. The current sensor 135 may comprise any circuit and/or device suitable for measuring the current of the battery 101. For example, the current sensor 135 may operate in conjunction with a sense resistor 155, wherein the current senor 135 measures a change in voltage across the sense resistor 155 to determine the load current $I_{DD}$.

In an exemplary embodiment, the fuel gauge circuit 110 may further comprise a capacity calculation circuit 125 to compute the remaining capacity (measured in amperehours) and/or the RSOC (the remaining capacity represented as a percentage). The capacity calculation circuit 125 may be connected to the voltage sensor 130 to receive the measured voltage $V_B$ data. The capacity calculation circuit 125 may also be connected to the current sensor 135 to receive the measured load current $I_{DD}$. The capacity calculation circuit 125 may be configured to compute the remaining capacity according to the measured voltage $V_B$ and/or the measured load current $I_{DD}$, and the charge current $I_{CC}$. For example, the capacity calculation circuit 125 may comprise any circuit and/or system suitable for computing the remaining capacity of the battery 101 according to conventional "voltage-based" methods and techniques or by a "coulomb counting" technique.

Figure 2:
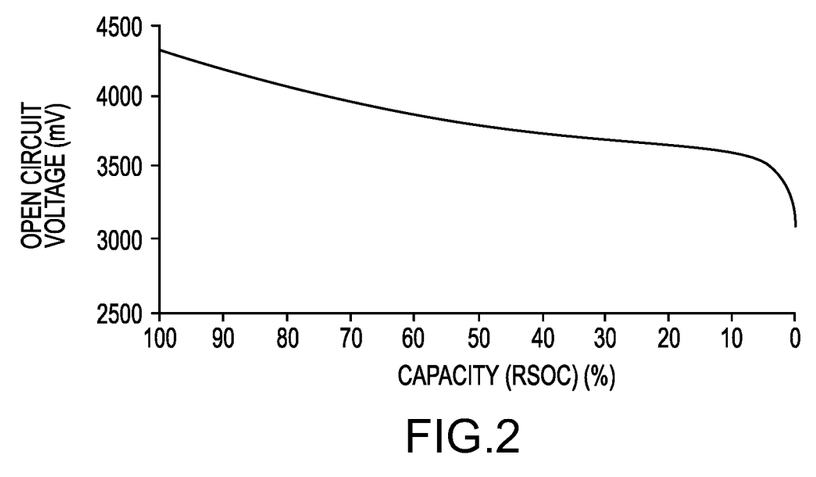
FIG. 2 is a graph of open circuit voltage as a function of battery capacity in accordance with an exemplary embodiment of the present technology.

In an exemplary embodiment, the fuel gauge circuit 110 may further comprise a memory 140 to store the known battery characteristics and/or profile data of the battery 101, such as the open circuit voltage characteristics of battery 101 (e.g., as illustrated in FIG. 2). The open circuit voltage characteristics may provide open circuit voltage $V_{OC}$ values as a function of the remaining capacity (RSOC) of the battery 101. The open circuit voltage characteristics may be predetermined by testing the battery 101 under open circuit (i.e., no load) conditions and may be stored in a look-up table or any other data storage suitable for storing relational data.

Figure 7:
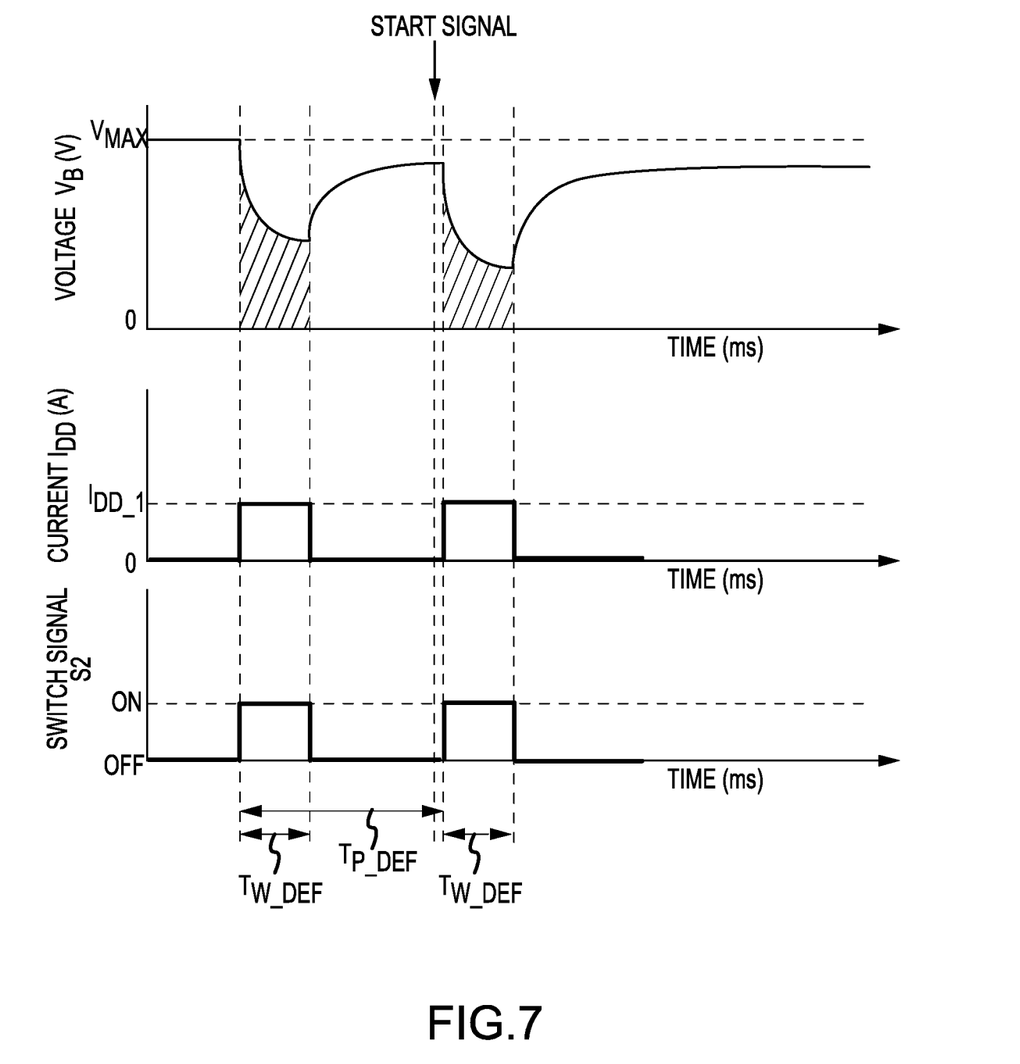
FIG. 7 representatively illustrates battery voltage as a function of time and load current as a function of time in accordance with an exemplary embodiment of the present technology.

Referring to FIGS. 1 and 7, the memory 140 may also store various previously- and currently-computed or measured variables, such as the battery voltage $V_B$, current $I_{DD}$, and the like. The memory 140 may also store pre-defined variables, such as the threshold voltage $V_{TH}$, the pre-defined load current $I_{DD\_1}$, the default duty cycle used to control the current supply from the battery 101 to the load 160 (i.e., discharge of the battery), and the like.

The default duty cycle may be defined according to the default pulse width $T_{W\_DEF}$ (measured in seconds) and the default total period $T_{P\_DEF}$ (measured in seconds), where the duty cycle is a ratio of time the load 160 is ON compared to the time the load 160 is OFF. In other words, the duty cycle may be expressed as a percentage of ON time, where the duty cycle is the pulse width divided by the total period (i.e., default duty cycle [%]=$T_{W\_DEF}/T_{P\_DEF}\times 100$).

According to embodiments of the present technology, the duty cycle of the second signal S2 may be used to operate the second switch 120 and thus control the load current $I_{DD}$. As such, the load current $I_{DD}$ is coincident with the duty cycle of the second signal S2. In other words, during the time of the pulse, the second switch 120 is closed (ON) and the load current $I_{DD}$ flows from the battery 101 to the load 160. At all other times, the second switch 120 is open and the load current $I_{DD}$ is zero. Accordingly, the pulse width may be referred to as the load time and the duty cycle may be referred to as the load cycle.

The default pulse width $T_{W\_DEF}$ and default total period $T_{P\_DEF}$ may be pre-defined variables assuming that the battery 101 is able to deliver a required amount of energy E to the load 160 and may be selected according to the particular application, load type, desired system specifications, and the like.

In addition, the memory 140 may store energy requirements for a particular function. For example, the system 100 may be required to provide a pre-defined energy level (measured in joules and defined as voltage [volts]×current [ampere]×time [seconds]) to the load 160 to perform a particular function. The system 100 may operate to provide the pre-defined energy level by supplying the load current $I_{DD}$ to the load 160 according to the default duty cycle or an adjusted duty cycle.

In the case of an "aroma therapy puff system," one puff for aroma therapy may require 15 joules to provide enough energy to a heating element (such as a heating coil) for the puff and this may be achieved by supplying a default current of 2 amperes for 2.5 seconds at 3 volts, resulting in a default duty cycle. Alternatively, a default current of 2 amperes for 3.5 seconds at 2.143 volts also provides the required 15 joules, resulting in an adjusted duty cycle.

The default current supplied to the load 160 may be based on the particular specifications of the battery 101 and/or maximum values suitable for the system 100 or particular application. For example, the system 100 may be limited to a maximum current output from the battery 101 and/or it may be desired to operate the system 100 according to a preferred current output to prevent overheating or other undesirable conditions due to over-current conditions.

The memory 140 may comprise any number of storage devices, such as registers, a flash memory device, EEPROM (electrically erasable programmable read-only memory), ROM (read only memory), and RAM (random access memory), and the like.

The fuel gauge circuit 110 may further comprise a first energy calculator circuit 165 configured to compute an ideal energy capability $E_1$ of the battery 101. In an exemplary embodiment, the ideal energy capability $E_1$ may be defined according to the following equation: $E_1 = V_{OC} \times I_{DD\_1} \times T_{W\_DEF}$, where $V_{OC}$ is an open circuit voltage determined according to the computed RSOC, $I_{DD\_1}$ is the pre-defined load current, and $T_{W\_DEF}$ is the default pulse width measured in seconds.

The first energy calculator circuit 165 may be connected to the capacity calculation circuit 125 and configured to receive the remaining capacity (or RSOC) of the battery 101. The first energy calculator circuit 165 may be in communication with the memory 140, wherein the first energy calculator circuit 165 may retrieve or otherwise receive data from the memory 140, such as the pre-defined load current $I_{DD\_1}$, time variables related to the default duty cycle, such as the default pulse width $T_{W\_DEF}$, and voltage data according to the remaining capacity. For example, the first energy calculator circuit 165 may have access to the look-up table containing the open circuit voltage data as a function of the remaining capacity and retrieve/receive the open circuit voltage value $V_{OC}$ associated with the computed remaining capacity. The first energy calculator circuit 165 may transmit the computed ideal energy capability $E_1$ to a logic circuit 150 for further analysis.

The first energy calculator circuit 165 may comprise any circuit and/or system suitable for performing computations (e.g., multiplication), retrieving/receiving data from a peripheral circuit (e.g., the open circuit voltage $V_{OC}$ from the memory 140), and transmitting data (e.g., the computed ideal energy capability $E_1$) for analysis.

The fuel gauge circuit 110 may further comprise a second energy calculator 170 configured to compute an actual energy capability $E_2$ of the battery 101. In an exemplary embodiment, the actual energy capability $E_2$ may be defined according to the following equation: $E_2 = V_B \times I_{DD\_1} \times T_{W\_DEF}$, where $V_B$ is a measured battery voltage, $I_{DD\_1}$ is the pre-defined current value supplied to the load 160, and $T_{W\_DEF}$ is the default pulse width measured in seconds.

The second energy calculator circuit 170 may be connected to the voltage sensor 130 and configured to receive the measured voltage $V_B$ of the battery 101. The second energy calculator circuit 170 may be in communication with the memory 140, wherein the second energy calculator circuit 170 may retrieve or otherwise receive data from the memory 140, such as the pre-defined load current $I_{DD\_1}$ and time variables associated with the default duty cycle, such as the default pulse width $T_{W\_DEF}$. The second energy calculator circuit 170 may transmit the computed actual energy capability $E_2$ to the logic circuit 150 for further analysis.

The second energy calculator circuit 170 may comprise any circuit and/or system suitable for performing computations (e.g., multiplication), retrieving/receiving data from a peripheral circuit (e.g., a measured battery voltage $V_B$ from the voltage sensor 130), and transmitting data (e.g., the computed actual energy capability $E_2$) for analysis.

In an exemplary embodiment, the fuel gauge circuit 110 may comprise the logic circuit 150, wherein the logic circuit 150 may perform various computations, determine an energy capability of the battery 101, adjust the duty cycle of the load current $I_{DD}$, control operation of the switches 115, 120, and the like.

The logic circuit 150 may be configured to access various data from the memory 140, such as the default total period $T_{P\_DEF}$, the default pulse width $T_{W\_DEF}$, and pre-defined load current $I_{DD\_1}$.

According to an exemplary embodiment, the logic circuit 150 may be further configured to receive the computed ideal energy capability $E_1$ from the first energy calculation circuit 165 and the actual energy capability $E_2$ from the second energy calculation circuit 170. The logic circuit 150 may compare the ideal energy capability $E_1$ with the actual energy capability $E_2$. For example, the logic circuit 150 may comprise a comparator (not shown) to determine if the actual energy capability $E_2$ is less than the ideal energy capability $E_1$. If the actual energy capability $E_2$ is less than the ideal energy capability $E_1$, then the logic circuit 150 may adjust the default duty cycle by either increasing the default pulse width $T_{W\_DEF}$ to an adjusted pulse width $T_{W\_ADJ}$ or increasing the default total period $T_{P\_DEF}$ to an adjusted total period $T_{P\_ADJ}$. If the actual energy capability $E_2$ is not less (equal to) the ideal energy capability $E_1$, then the logic circuit 150 may operate the second switch 120 according to the default duty cycle.

The logic circuit 150 may be further configured to compute the adjusted pulse width $T_{W\_ADJ}$ according to the amount of energy E required for a particular task, the measured voltage $V_B$, and the pre-defined load current $I_{DD\_1}$. In an exemplary embodiment, the adjusted pulse width $T_{W\_ADJ}$ may be described according to the following equation: $T_{W\_ADJ} = E/(I_{DD\_1} \times V_B)$, where E is the energy required to perform the task.

The logic circuit 150 may be configured to control the duty cycle of the second signal S2, which controls the second switch 120, and thus control the flow of the load current $I_{DD}$. For example, the logic circuit 150 may generate the second signal S2 according to the default duty cycle under certain circumstances and may generate the second signal S2 according to the adjusted duty cycle under different circumstances.

The logic circuit 150 may comprise any number of circuits, systems, and/or logic gates to perform the desired computations and/or analysis, as described above. For example, the logic circuit 150 may comprise a field programmable gate array, an application specific integrated circuit, and the like. The logic circuit 150 may further comprise any circuit and/or system suitable for generating a pulse-width modulated signal, such as a PMW controller (not shown), a timer (not shown), a waveform generator, flip flops, and the like.

In various embodiments, the system 100 may operate to ensure that the load 160 is provided with sufficient energy to perform a desired function/task initiated by the user of the electronic device. The system 100 may determine the energy capability of the battery 101 and adjust the duty cycle that controls the load current $I_{DD}$ to provide the energy required. In some cases, the system 100 may increase the pulse period of the duty cycle, and in other cases, may increase the total period of the duty cycle.

In an exemplary operation, and referring to FIGS. 1-9, the operation may be initiated when the system 100 receives the start signal (300) from the host control system. The system 100 may then compute the ideal energy capability $E_1$ of the battery 101 (305). Computing the ideal energy capability $E_1$ may comprise computing the remaining capacity (RSOC) of the battery 1010 (405) (for example according to a "voltage-based" method or "coulomb counting" method), extracting, from the memory 140, an open circuit voltage $V_{OC}$ corresponding to the computed RSOC (410). For example, the remaining capacity calculation circuit 125 may compute the remaining capacity and transmit the computed RSOC to the first energy calculator circuit 165. Computing the ideal energy capability may further comprise retrieving an open circuit voltage value $V_{OC}$, the pre-defined load current $I_{DD\_1}$, and the default load time (i.e., the default pulse width $T_{W\_DEF}$) (415). For example, the first energy calculator 165 may extract the open circuit voltage $V_{OC}$ based on the computed RSOC, and retrieve/receive the pre-defined load current $I_{DD\_1}$, and the default pulse width $T_{W\_DEF}$ from the memory 140. The memory 140 may also store the extracted open circuit voltage value $V_{OC}$ in a register (not shown). The first energy calculator circuit 165 may then compute the ideal energy capability $E_1$ according to the following: $E_1 = V_{OC} \times I_{DD\_1} \times T_{W\_DEF}$ (420).

Figure 3:
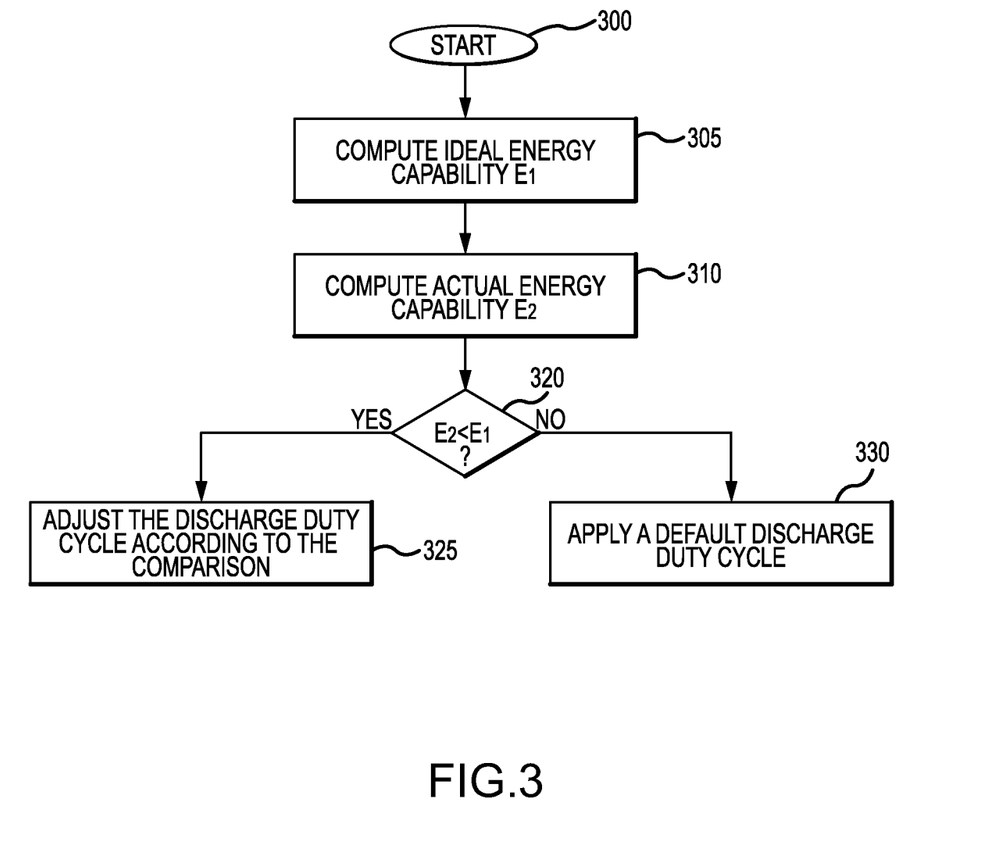
FIG. 3 is a flow chart for determining a duty cycle of a current from a battery to a load in accordance with an exemplary embodiment of the present technology.
Figure 4:
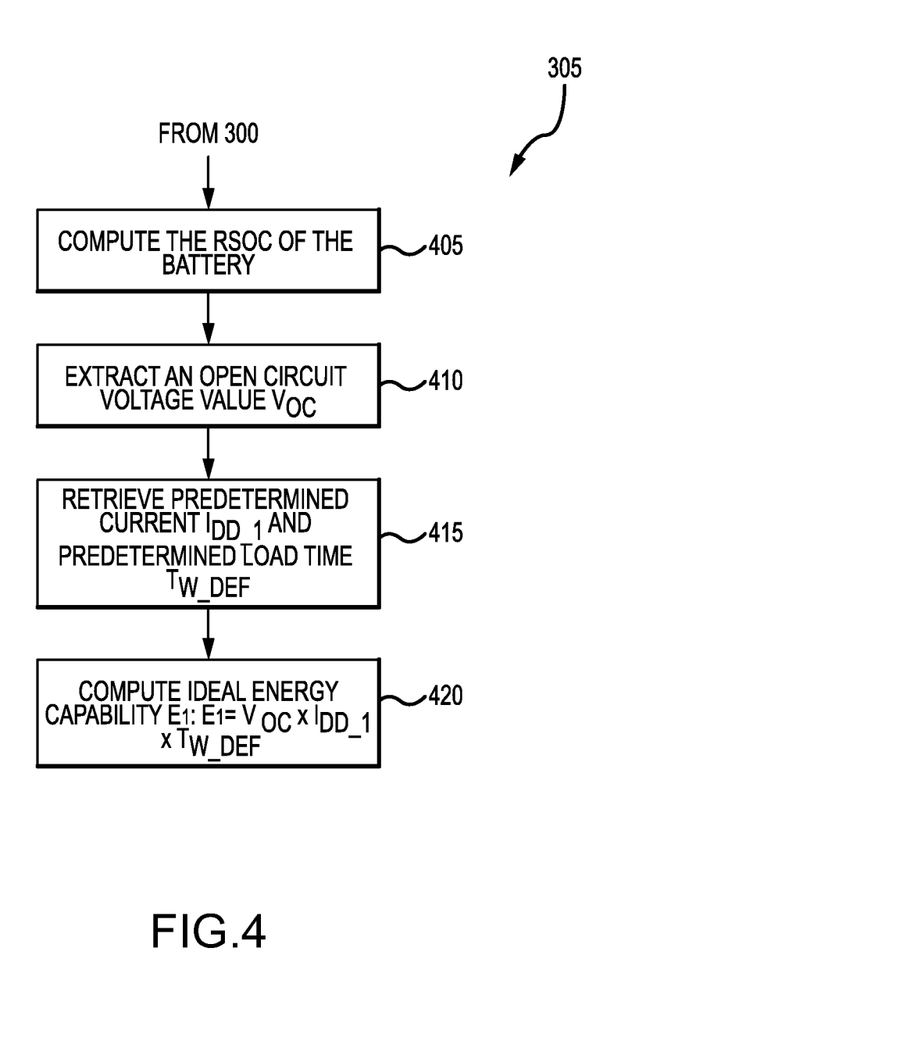
FIG. 4 is a flow chart for computing an ideal energy capability of the battery in accordance with an exemplary embodiment of the present technology.
Figure 5:
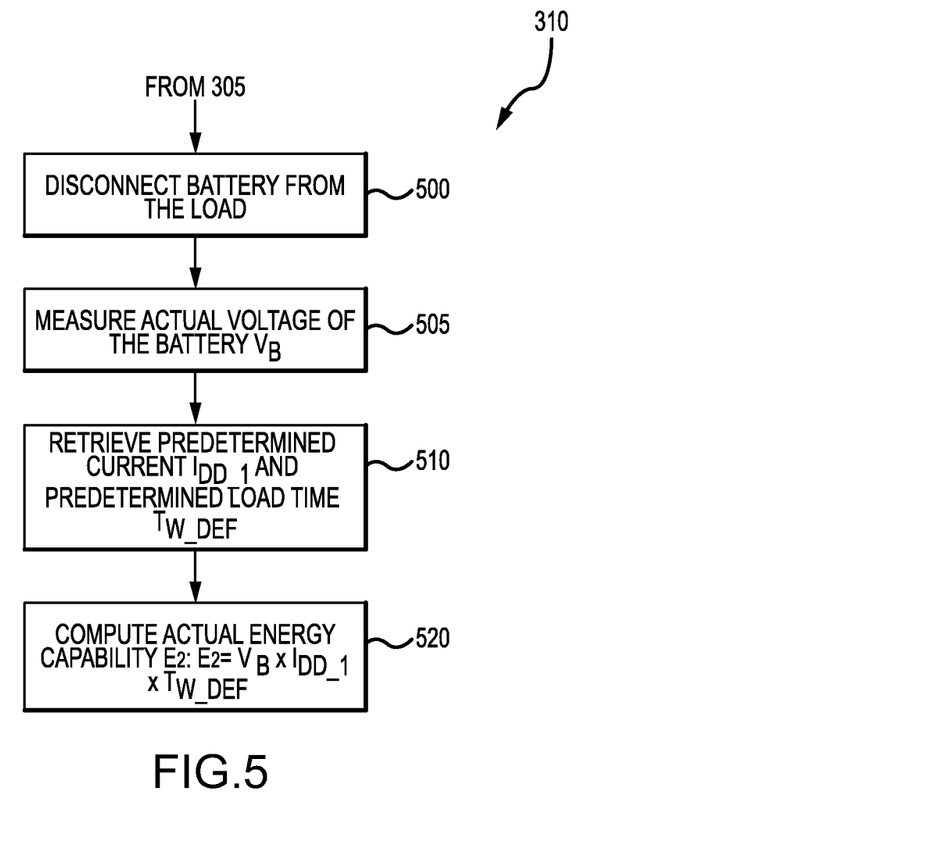
FIG. 5 is a flow chart for computing an actual energy capability of the battery in accordance with an exemplary embodiment of the present technology.

The system 100 may then compute the actual energy capability $E_2$ of the battery 101 (310). Computing the actual energy capability $E_2$ of the battery 101 may comprise disconnecting the battery 101 from the load 160 (500) and measuring the actual voltage $V_B$ of the battery 101 (505). Computing the actual energy capability $E_2$ may further comprise retrieving/receiving the pre-defined load current $I_{DD\_1}$ and the default load time (i.e., the default pulse width $T_{W\_DEF}$). For example, the second energy calculator circuit 170 may retrieve/receive the battery voltage $V_B$ from the voltage sensor 130 and retrieve/receive the pre-defined load current $I_{DD\_1}$ and the default pulse width $T_{W\_DEF}$ from the memory 140. The second energy calculator circuit 170 may transmit the measured battery voltage $V_B$ to the memory 140, wherein the memory 140 may store the value in a register.

The system 100 may then compare the computed ideal energy capability $E_1$ with the computed actual energy capability $E_2$. For example, the logic circuit 150 may receive the computed ideal energy capability $E_1$ from the first energy calculator circuit 165 and receive the computed actual energy capability $E_2$ from the second energy calculator circuit 170 and determine if the actual energy capability $E_2$ is less than ideal energy capability $E_1$. Alternatively, the logic circuit 150 may determine if the computed if the actual energy capability $E_2$ is equal to the ideal energy capability $E_1$.

If the actual energy capability $E_2$ is not less than ideal energy capability $E_1$, then the system 100 may generate the second signal S2 according to the default duty cycle (330), and thus, operate the second switch 120 according to the default duty cycle.

If the actual energy capability $E_2$ is less than ideal energy capability $E_1$, then the system 100 may adjust the default duty cycle (and the flow of the load current $I_{DD}$ from the battery 101 to the load 160), generate the second signal S2 according to the adjusted duty cycle, and thus, operate the second switch 120 according to the default duty cycle (325).

Figure 6:
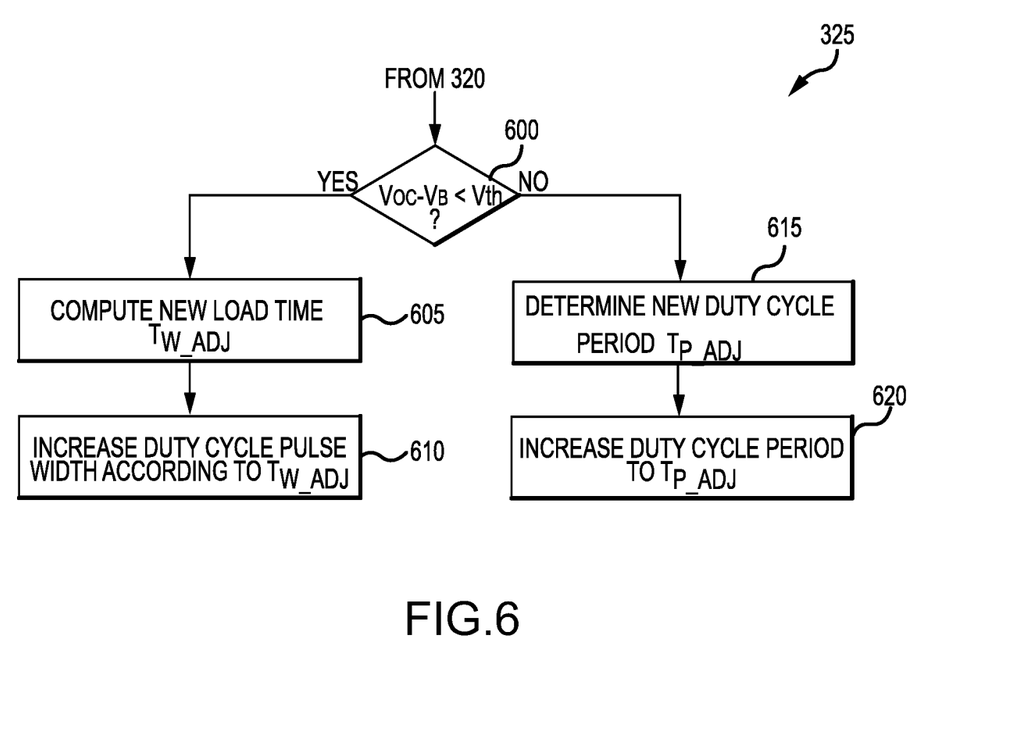
FIG. 6 is a flow chart for adjusting the discharge duty cycle of the battery in accordance with an exemplary embodiment of the present technology.

Adjusting the default duty cycle of the second signal S2 may comprise adjusting the default pulse width $T_{W\_DEF}$ or adjusting the default total period $T_{P\_DEF}$. The system 100 may compare the open circuit voltage $V_{OC}$ (as determined from step 410) to the measured battery voltage $V_B$ (as measured in step 505). For example, the logic circuit 150 may retrieve/receive the open circuit voltage $V_{OC}$ and the measured battery voltage $V_B$ from the memory 140 and determine if a difference of the open circuit voltage $V_{OC}$ and measured voltage $V_B$ is less than the threshold voltage $V_{TH}$ (600). Alternatively, the logic circuit 150 may receive the open circuit voltage $V_{OC}$ from the first energy calculator circuit 165 and the measured battery voltage $V_B$ from the second energy calculator circuit 170.

Figure 9:
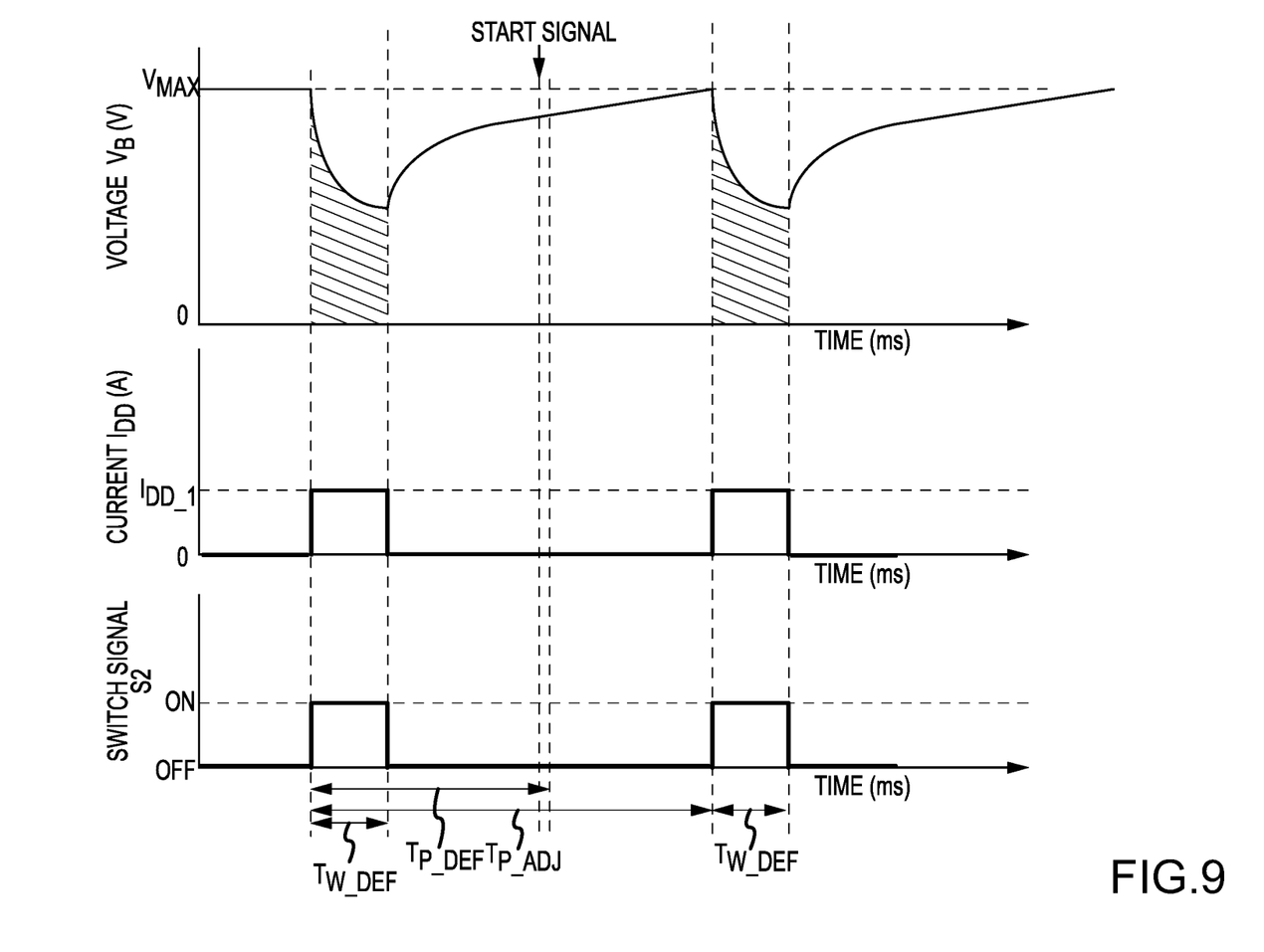
FIG. 9 representatively illustrates battery voltage as a function of time and load current as a function of time in accordance with an exemplary embodiment of the present technology.

Referring to FIGS. 1, 3, 6, and 9, if the difference is not less than the threshold voltage $V_{TH}$, then the system 100 may determine a new duty cycle period $T_{P\_ADJ}$ (615) and increase the total period of the default duty cycle to the adjusted total period $T_{P\_ADJ}$ (620). For example, the system 100 may apply the adjusted total period $T_{P\_ADJ}$ a present duty cycle, as illustrated in FIG. 9. Increasing the total period to the adjusted total period $T_{P\_ADJ}$ may ensure that the battery 101 provides the required amount of energy (defined according to particular function/task and application), to the load 160 on the next load cycle, wherein the energy provided to the load 160 is represented as the area under the voltage curve.

The system 100 may determine the new duty cycle period (adjusted total period) $T_{P\_ADJ}$ by selecting the value from a set of pre-defined values according to known battery characteristics related to a recovery time of the battery 101. The recovery time may be defined as the amount of time it takes for the battery 101 to return to a maximum voltage $V_{MAX}$ from a starting voltage. The recovery time at various starting voltages may be determined through battery testing. For example, if the maximum voltage $V_{MAX}$ of the battery 101 is 4.2 V and the starting voltage is 3.7 V, then it may take 10 seconds for the battery 101 to recover to the maximum voltage $V_{MAX}$—in this case, the system 100 would determine that the new duty cycle period should be 10 seconds so that the battery 101 can recover to the maximum voltage $V_{MAX}$. If the starting voltage is 3.3 V, then it may take 60 seconds for the battery 101 to recover to the maximum voltage $V_{MAX}$—in this case, the system 100 would determine that the new duty cycle period should be 60 seconds so that the battery 101 can recover to the maximum voltage $V_{MAX}$. The memory 140 may store the set of pre-defined total period values as a function of the battery voltage $V_B$ in a look-up table, which may be accessible to the logic circuit 150.

Figure 8:
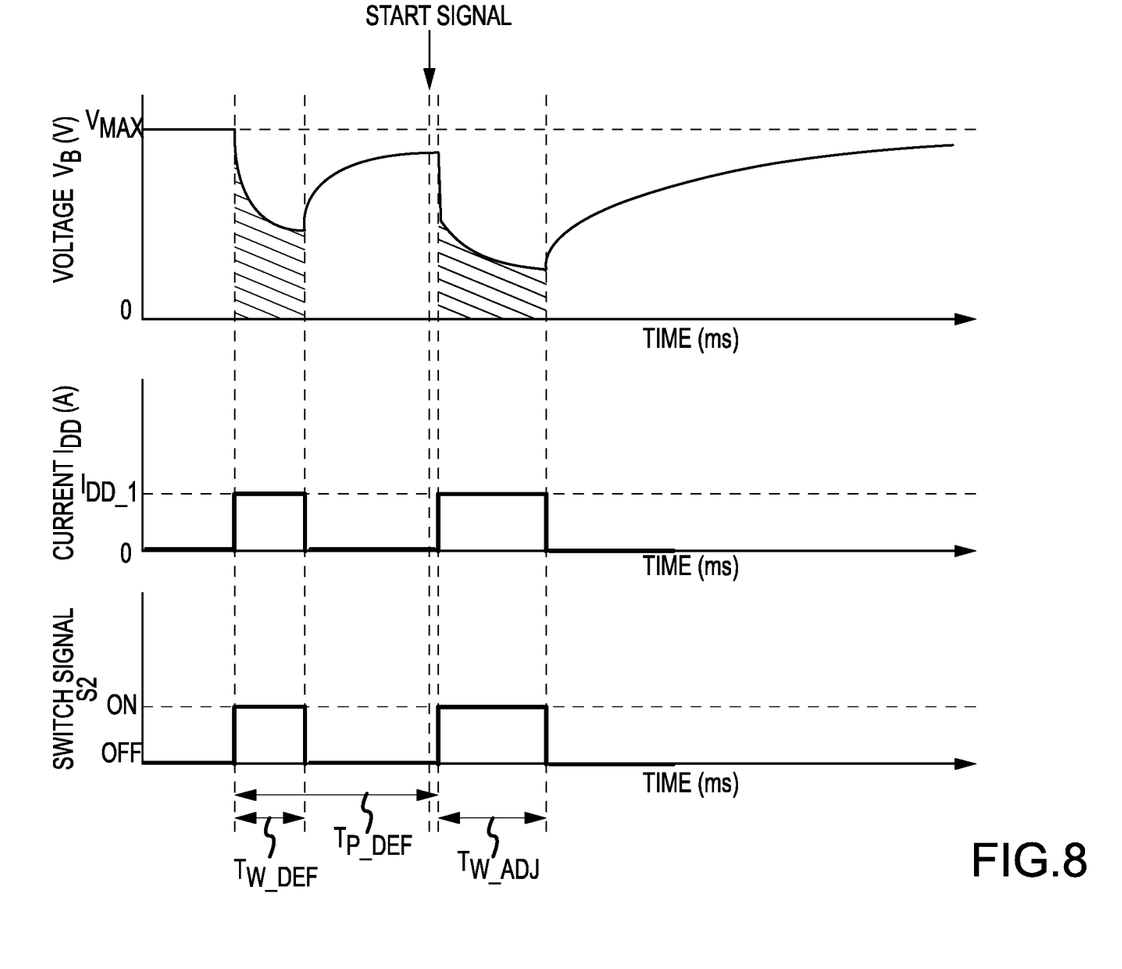
FIG. 8 representatively illustrates battery voltage as a function of time and load current as a function of time in accordance with an exemplary embodiment of the present technology.

Referring to FIGS. 1, 3, 6, and 8, if the difference is less than the threshold voltage $V_{TH}$, then the system 100 may compute a new load time (i.e., a new pulse width) (605) and increase the pulse width of the default duty cycle to the adjusted pulse width $T_{W\_ADJ}$ (610). The logic circuit 150 may compute the adjusted pulse width $T_{W\_ADJ}$ according to the equation described above, and apply the adjusted pulse width $T_{W\_ADJ}$ to a next duty cycle, as illustrated in FIG. 8. Increasing the pulse width to the adjusted pulse width $T_{W\_ADJ}$ may ensure that the battery 101 provides the required amount of energy to the load 160 (defined according to particular function/task and application) on the next load cycle, wherein the energy provided to the load 160 is represented as the area under the voltage curve.

Referring to FIGS. 1 and 7, if the system 100 supplies the load current $I_{DD}$ to the load 160 according to the default duty cycle and without estimating the energy capability of the battery 101 and adjusting the load duty cycle, the energy provided to the load 160 during the next load cycle may not be enough to meet the energy requirements for a particular function/task. For example, the system 100 may be activated to perform a first task that requires a certain amount of energy and then activated again at a later time to perform the same task (second task) requiring the same amount of energy. Assuming that the area under the voltage curve during the first load cycle represents the energy required and used for the first task and the area under the voltage curve during the second load cycle represents the energy used for the second task, it can be observed that the energy used during the second task is less than the energy from the first task. Therefore, the battery 101 has not delivered the energy required to perform the task, such as starting a vehicle engine, and the load 160 may not respond as desired.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A fuel gauge circuit configured to connect to a battery and a load, comprising:
    a voltage sensor to measure a voltage of the battery;
    a memory storing:
        a predetermined current value;
        a predetermined load period; and
        battery characteristic data indicating a relationship between relative state of charge and open circuit voltage;
    a first circuit responsive to the voltage sensor, wherein the first circuit computes a relative state of charge (RSOC) of the battery;
    a second circuit in communication with the memory, wherein the second circuit computes a first energy capability of the battery based on the computed relative state of charge, the battery characteristic data, the predetermined load period, and the predetermined current value;
    a third circuit in communication with the memory, wherein the third circuit computes a second energy capability of the battery based on the measured voltage of the battery; and
    a logic circuit connected to the second and third circuits and configured to determine a load current duty cycle according to the first and second energy capabilities.

2. The fuel gauge circuit according to claim 1, wherein the logic circuit compares the computed first energy capability to the computed second energy capability.

3. The fuel gauge circuit according to claim 1, wherein the logic circuit increases a pulse width of the load current duty cycle from a default pulse width if the computed second energy capability is less than the computed first energy capability.

4. The fuel gauge circuit according to claim 1, wherein the logic circuit increases a pulse period of the load current duty cycle from a default pulse period if the computed second energy capability is less than the computed first energy capability.

5. The fuel gauge circuit according to claim 1, wherein the second circuit extracts a first open circuit voltage from the battery characteristic data according to the computed RSOC.

6. The fuel gauge circuit according to claim 1, wherein the first energy capability is a product of an open circuit voltage value from the battery characteristic data, the predetermined current value, and the predetermined load period.

7. The fuel gauge circuit according to claim 1, wherein the second energy capability is a product of the measured voltage, the predetermined current value, and the predetermined load period.

8. The fuel gauge circuit according to claim 1, wherein the fuel gauge facilitates discharging the battery according to the load current duty cycle.

9. A method for controlling a duty cycle of a current from a battery to a load, comprising:
    computing an ideal energy capability of the battery, comprising:
        computing a relative state of charge of the battery; and
        extracting, from predetermined battery characteristic data, an open circuit voltage value associated with the computed relative state of charge; and
        multiplying the extracted open circuit voltage, a predetermined time, and a predetermined current value;
    computing an actual energy capability of the battery;

comparing the ideal energy capability to the actual energy capability; and adjusting a discharge duty cycle of the battery according to the comparison of the ideal and actual energy capabilities.

10. The method according to claim 9, wherein computing the actual energy capability comprises:
disconnecting the battery from the load; and
measuring an actual voltage of the battery.

11. The method according to claim 10, wherein computing the actual energy capability comprises multiplying the measured actual voltage, a predetermined time, and a predetermined current.

12. The method according to claim 9, wherein adjusting the discharge duty cycle comprises increasing a pulse width of the discharge duty cycle from a default pulse width if the computed actual energy capability is less than the computed ideal energy capability.

13. The method according to claim 9, wherein adjusting the discharge duty cycle comprises increasing a pulse period of the discharge duty cycle from a default pulse period if the computed actual energy capability is less than the computed ideal energy capability.

14. A system, comprising:
a battery selectively connected to a load via a switch; and
a fuel gauge circuit connected to the battery and configured to:
measure a voltage of the battery;
store:
a predetermined current value;
a predetermined load period; and
battery characteristic data indicating a relationship between relative state of charge and open circuit voltage;
compute a relative state of charge (RSOC) of the battery;
extract a first open circuit voltage from the battery characteristic data according to the computed RSOC;
compute an ideal energy capability of the battery, wherein the ideal energy capability is the product of the first open circuit voltage, the predetermined current, and the predetermined load period;
compute an actual energy capability of the battery, wherein the actual energy capability is the product of the measured voltage, the predetermined current, and predetermined load period;
determine a load current duty cycle according to the ideal and actual energy capabilities; and
operate the switch according to the load current duty cycle.

15. The system according to claim 14, wherein the fuel gauge circuit is further configured to:
determine a difference of the first open circuit voltage and the measured voltage; and compare the difference to a threshold value.

16. The system according to claim 14, wherein the fuel gauge circuit increases a pulse width of the load current duty cycle relative to a default pulse width if;
the computed actual energy capability is less than the computed ideal energy capability; and
the difference is less than the threshold value.

17. The system according to claim 14, wherein the fuel gauge circuit increases a pulse period of the load current duty cycle relative to a default pulse period if;
the computed actual energy capability is less than the computed ideal energy capability; and
the difference is greater than the threshold.

18. The system according to claim 14, wherein the fuel gauge circuit operates the switch according to a default load current duty cycle if the computed actual energy capability is equal to the computed ideal energy capability.

* * * * *